US012652965B2

(12) United States Patent
Griggio et al.

(10) Patent No.: US 12,652,965 B2
(45) Date of Patent: Jun. 9, 2026

(54) TEMPERATURE SENSING OF REGIONS WITHIN A SUPERCONDUCTING INTEGRATED CIRCUIT USING IN-SITU RESONATORS

(71) Applicant: Microsoft Technology Licensing, LLC, Redmond, WA (US)

(72) Inventors: Flavio Griggio, Seattle, WA (US); Richard P. Rouse, Kirkland, WA (US); Vladimir V. Talanov, Ellicott City, MD (US); Cougar Alessandro Tomas Garcia, Baltimore, MD (US); Joshua A. Strong, Ellicott City, MD (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 1091 days.

(21) Appl. No.: 17/218,458

(22) Filed: Mar. 31, 2021

(65) Prior Publication Data

US 2022/0328747 A1     Oct. 13, 2022

(51) Int. Cl.
*H10N 60/80*          (2023.01)
*G01K 7/01*           (2006.01)
(Continued)

(52) U.S. Cl.
CPC ............. *H10N 60/805* (2023.02); *G01K 7/01* (2013.01); *H10N 60/12* (2023.02); *H10N 60/80* (2023.02); *H10N 60/85* (2023.02); *H10N 69/00* (2023.02)

(58) Field of Classification Search
CPC .................................................. H10N 60/805
See application file for complete search history.

(56) References Cited

U.S. PATENT DOCUMENTS

| | | | |
|---|---|---|---|
| 2009/0138241 A1 | 5/2009 | Gutierrez et al. | |
| 2010/0177801 A1 | 7/2010 | Geren et al. | |
| (Continued) | | | |

FOREIGN PATENT DOCUMENTS

| | | |
|---|---|---|
| JP | S61138131 A | 6/1986 |
| JP | 2020520124 A | 7/2020 |
| (Continued) | | |

OTHER PUBLICATIONS

"International Search Report and Written Opinion Issued in PCT Application No. PCT/US2022/017714", Mailed Date: Jun. 24, 2022, 13 Pages.

(Continued)

*Primary Examiner* — Paul A Wartalowicz
(74) *Attorney, Agent, or Firm* — Ranjeev Singh; Singh Law, PLLC

(57)          ABSTRACT

Circuits and methods related to temperature sensing of regions within a superconducting integrated circuit (IC) using in-situ resonators are described. An example relates to a superconducting IC including a first resonator having a first spatial location in relation to a floor plan of the superconducting IC. The superconducting IC further includes a second resonator having a second spatial location in relation to the floor plan of the superconducting IC. The superconducting IC further includes a feed line configured to provide a test signal to each of the first resonator and the second resonator in order to elicit a frequency response from the first resonator or the second resonator, where the frequency response is correlated with a first region within the superconducting IC corresponding to the first spatial location or with a second region within the superconducting IC corresponding to the second spatial location.

20 Claims, 9 Drawing Sheets

(51) Int. Cl.
  H10N 60/12    (2023.01)
  H10N 60/85    (2023.01)
  H10N 69/00    (2023.01)

(56)                References Cited

U.S. PATENT DOCUMENTS

| | | |
|---|---|---|
| 2019/0018078 A1 | 1/2019 | Nelson |
| 2019/0051810 A1 | 2/2019 | Brink |
| 2019/0341668 A1* | 11/2019 | White .................... G06N 10/40 |
| 2021/0003457 A1 | 1/2021 | Olivadese et al. |

FOREIGN PATENT DOCUMENTS

| | | |
|---|---|---|
| KR | 20200051769 A | 5/2020 |
| WO | 2014016867 A1 | 1/2014 |
| WO | 2022189284 A1 | 9/2022 |

OTHER PUBLICATIONS

Communication pursuant to Article 94(3) Received in European Patent Application No. 22712121.7, mailed on Jul. 22, 2025, 6 pages.
First Office Action Received for Chinese Application No. 202280022666.X, mailed on Mar. 12, 2026, 21 pages. (English Translation Provided).
Office Action Received for Japanese Application No. 2023-559014, mailed on Mar. 17, 2026, 09 pages. (English Translation Provided).
Office Action Received for Korean Application No. 10-2023-7036046, mailed on Apr. 15, 2026, 25 pages. (English Translation Provided).

\* cited by examiner

Figure 8:
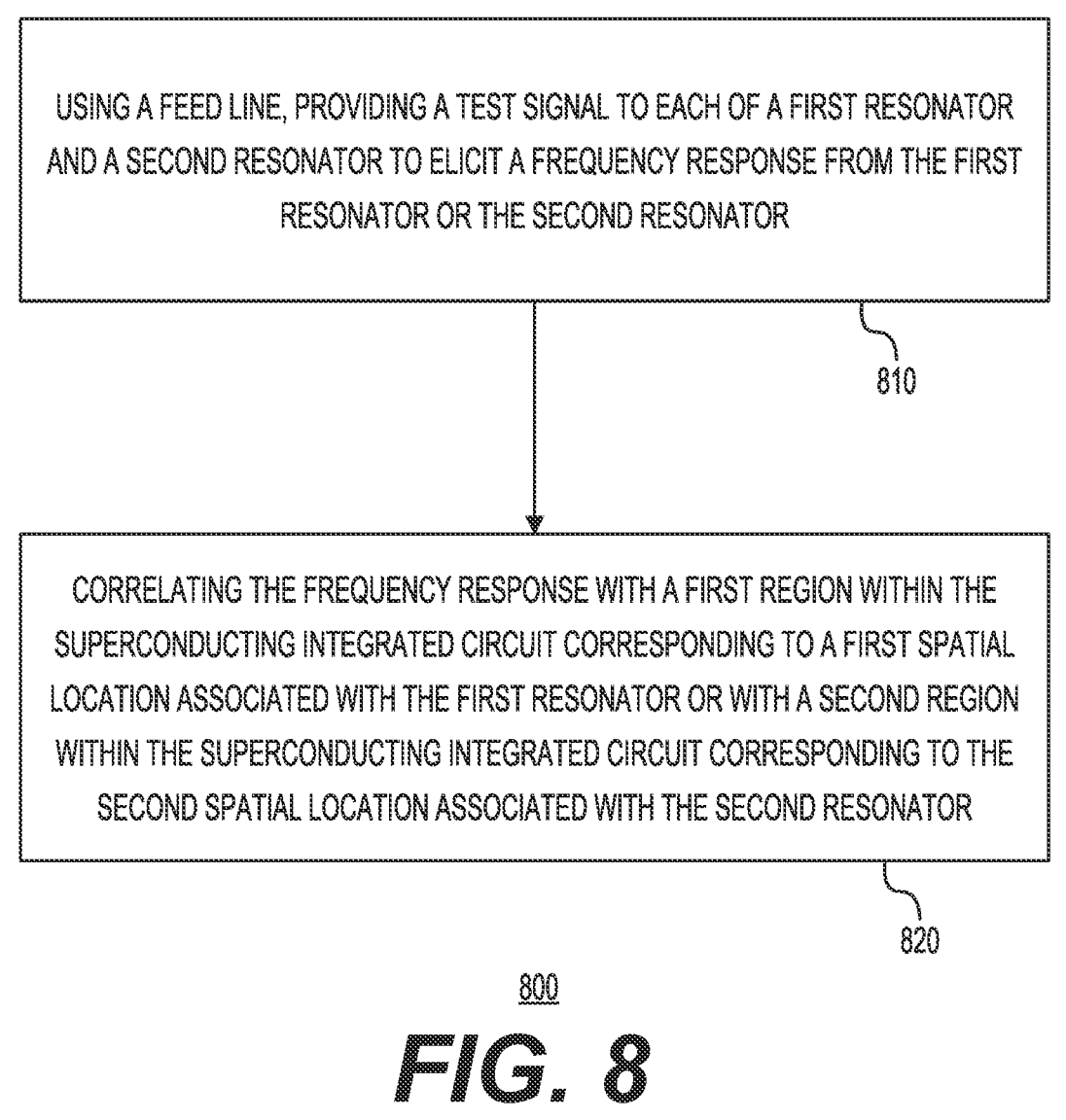

USING A FEED LINE, PROVIDING A TEST SIGNAL TO EACH OF A FIRST RESONATOR AND A SECOND RESONATOR TO ELICIT A FREQUENCY RESPONSE FROM THE FIRST RESONATOR OR THE SECOND RESONATOR

810

CORRELATING THE FREQUENCY RESPONSE WITH A FIRST REGION WITHIN THE SUPERCONDUCTING INTEGRATED CIRCUIT CORRESPONDING TO A FIRST SPATIAL LOCATION ASSOCIATED WITH THE FIRST RESONATOR OR WITH A SECOND REGION WITHIN THE SUPERCONDUCTING INTEGRATED CIRCUIT CORRESPONDING TO THE SECOND SPATIAL LOCATION ASSOCIATED WITH THE SECOND RESONATOR

TEMPERATURE SENSING OF REGIONS WITHIN A SUPERCONDUCTING INTEGRATED CIRCUIT USING IN-SITU RESONATORS

BACKGROUND

Semiconductor based integrated circuits used in electronic devices, such as digital processors, include digital circuits based on complimentary metal-oxide semiconductor (CMOS) technology or similar technologies. CMOS technology, however, is reaching its limits in terms of the device size. In addition, power consumption at high clock speeds by digital circuits based on the CMOS technology has increasingly become a limiting factor in high performance digital circuits and systems.

As an example, servers in a data center are increasingly consuming large amounts of power. The consumption of power is partly the result of power loss from the dissipation of energy even when the CMOS circuits are inactive. This is because even when such circuits are inactive, and are not consuming any dynamic power, they still consume power because of the need to maintain the state of CMOS transistors. In addition, in CMOS circuits there is a certain amount of current leakage even when the CMOS circuits are inactive. Thus, even when such circuits are not processing information, a certain amount of power is wasted not only as a result of the requirement to maintain the state of the CMOS transistors, but also as a result of the current leakage.

An alternative approach to the use of processors and related components, based on CMOS technology, is the use of superconducting logic based circuits. Integrated circuits implemented on a chip may have different local operating temperature in different regions of the chip.

SUMMARY

In one example, the present disclosure relates to a superconducting integrated circuit including a first resonator having a first resonant frequency, where the first resonator has a first spatial location in relation to a floor plan of the superconducting integrated circuit. The superconducting integrated circuit may further include a second resonator having a second resonant frequency, different from the first resonant frequency, where the second resonator has a second spatial location in relation to the floor plan of the superconducting integrated circuit, and where the second spatial location is different from the first spatial location. The superconducting integrated circuit may further include a feed line configured to provide a test signal to each of the first resonator and the second resonator in order to elicit a frequency response from the first resonator or the second resonator, where the frequency response is correlated with a first region within the superconducting integrated circuit corresponding to the first spatial location or with a second region within the superconducting integrated circuit corresponding to the second spatial location.

In another aspect, the present disclosure relates to a method for sensing an operating temperature of regions within a superconducting integrated circuit, where the superconducting integrated circuit comprises a first resonator having a first resonant frequency, where the first resonator has a first spatial location in relation to a floor plan of the superconducting integrated circuit and a second resonator having a second resonant frequency, different from the first resonant frequency, where the second resonator has a second spatial location in relation to the floor plan of the superconducting integrated circuit, and where the second spatial location is different from the first spatial location. The method may include using a feed line, providing a test signal to each of the first resonator and the second resonator to elicit a frequency response from the first resonator or the second resonator. The method may further include correlating the frequency response with a first region within the superconducting integrated circuit corresponding to the first spatial location associated with the first resonator or with a second region within the superconducting integrated circuit corresponding to the second spatial location associated with the second resonator.

In yet another aspect, the present disclosure relates to a superconducting integrated circuit including a first resonator having a first resonant frequency, where the first resonator comprises a first inductive element shunted by a first capacitive element, where the first inductive element comprises a first meandering inductor having a first length, and where the first resonator has a first spatial location in relation to a floor plan of the superconducting integrated circuit. The superconducting integrated circuit may further include a second resonator having a second resonant frequency, different from the first resonant frequency, where the second resonator comprises a second inductive element shunted by a second capacitive element, where the second inductive element comprises a second meandering inductor having a second length, where the second length is selected to be different from the first length by an amount sufficient to ensure a detectable difference between the first resonant frequency and the second resonant frequency, where the second resonator has a second spatial location in relation to the floor plan of the superconducting integrated circuit, and where the second spatial location is different from the first spatial location. The superconducting integrated circuit may further include a feed line configured to provide a test signal to each of the first resonator and the second resonator in order to elicit a frequency response from the first resonator or the second resonator, where the frequency response is correlated with a first region within the superconducting integrated circuit corresponding to the first spatial location or with a second region within the superconducting integrated circuit corresponding to the second spatial location.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

FIG. 6 is a diagram of a floor plan of a top layer of a superconducting integrated circuit (IC) chip including a feed line coupled to resonators placed in different spatial locations of the top layer of the superconducting IC chip and a floor plan of a bottom layer of the superconducting IC chip including a bottom feed line coupled to resonators placed in different spatial locations of the bottom layer of the superconducting IC chip in accordance with one example;

FIG. 7 shows a top view of a resonator formed as a meander in a superconducting integrated circuit in accordance with one example; and FIG. 8 is a flow chart of a method for sensing an operating temperature of regions within a superconducting integrated circuit.

DETAILED DESCRIPTION

Figure 1:
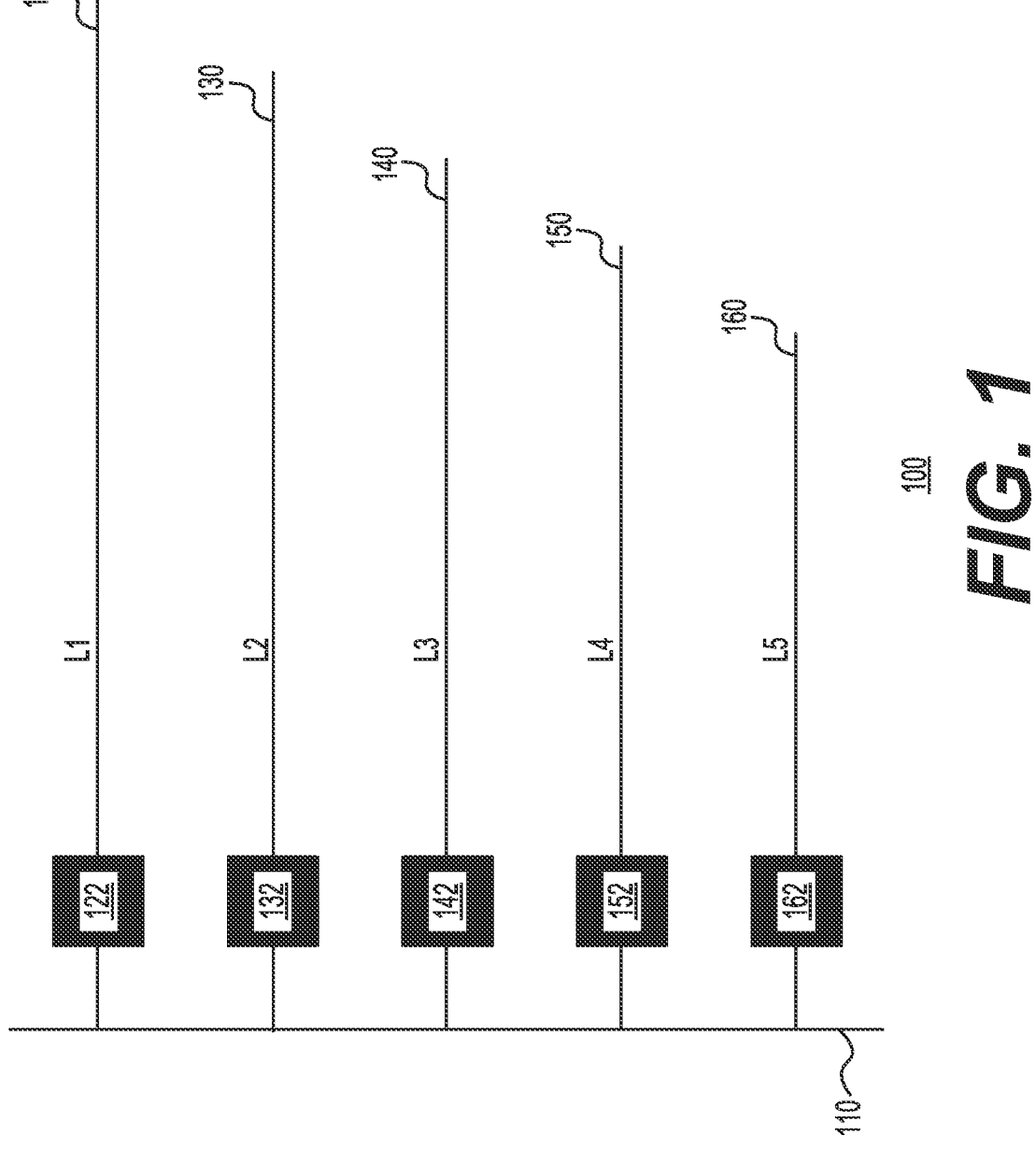
FIG. 1 is a diagram of a superconducting integrated circuit including in-situ resonators for temperature sensing of regions within the superconducting integrated circuit in accordance with one example.

Examples described in this disclosure relate to temperature sensing of regions within a superconducting integrated circuit using in-situ resonators. Certain examples further relate to in-situ monitoring of the on-chip temperature profiles. Certain examples integrate a feed line with several notch-type half wavelength resonators that are shunted with a coupling capacitor. Each resonator can be designed with a specific length relating to a specific resonant frequency. Such resonators can be spatially distributed within the chip. In this manner, the specific resonant frequency can be used as a signature to correlate the response to a particular spatial location on the chip. The superconducting integrated circuit chip may include reciprocal quantum logic (RQL) circuits that may be implemented using wave pipelined logic. Such RQL circuits may act as low-power superconductor logic circuits. Other examples of superconducting circuits relate to rapid single flux quantum (RSFQ) circuits. Such circuits may be included as part of quantum computers.

Unlike CMOS transistors, superconductor circuits use Josephson junction based devices. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the RQL circuits. As an example, superconductors are materials that can carry a direct electrical current (DC) in the absence of an electric field. Such materials have almost zero resistance at or below their critical temperature. One example superconductor, niobium, has a critical temperature (Tc) of 9.3 Kelvin. At temperatures below Tc, niobium is superconductive; however, at temperatures above Tc, it behaves as a normal metal with electrical resistance. Thus, in the SIS type of Josephson junctions, superconductors may be niobium superconductors and insulators may be $Al_2O_3$ barriers. In SIS type of junctions, when a wave function tunnels through the barrier, a changing phase difference in time in the two superconductors creates a potential difference between the two superconductors. In RQL circuits, in one example, the SIS type of junction may be part of a superconducting loop. When the potential difference between the two superconductors is integrated with respect to time over one cycle of phase change, the magnetic flux through the loop changes by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In RQL circuits, each Josephson junction may be part of one or more superconducting loops. The phase difference across the junction may be modulated by the magnetic flux applied to the loop.

Various RQL circuits, including transmission lines, can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The RQL circuits may advantageously have zero static power dissipation because of the absence of bias resistors. In addition, the RQL circuits may be powered using alternating current (AC) power, thereby eliminating the ground return current. The AC power supply may also act as a stable dock reference signal for the RQL circuits. In one example, the digital data may be encoded using a pair of positive and negative (reciprocal) SFQ pulses. As an example, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock.

The building blocks of exemplary RQL circuits may include various types of logic gates. Exemplary logic gates include an AND gate, an OR gate, a logical A-and-not-B gate and a logical AND/OR gate. The A-and-not-B gate may have two inputs and one output. An input pulse A may propagate to the output when favorable clock conditions may be present on an output Josephson transmission line (JTL), unless an input pulse B comes first with respect to either input pulse A or the favorable clock conditions on the output JTL. The logical behavior of the gate is based on the reciprocal data encoding mentioned earlier. As an example, a positive pulse changes the internal flux state of the inductive loop, but the trailing negative pulse erases the internal state every clock cycle, which in turn produces combinational logic behavior.

Integrated circuit chips including superconducting circuits can have local temperature variations that can directly or indirectly affect the superconducting circuits operating margins. Without in-situ monitoring of the on-chip temperature profiles, a chip designer may not be able to optimize circuit layout and circuit design to ensure compliance with the operating margins. Certain examples described in this disclosure relate to in-situ monitoring of the on-chip temperature profiles. Certain examples integrate a feed line with several notch-type half wavelength resonators that are shunted with a coupling capacitor. Each resonator can have a specific length relating to a specific resonant frequency. Such resonators can be spatially distributed within the chip. In this manner, the specific resonant frequency can be used as a signature to correlate the response to a particular spatial location on the chip. The result of the on-chip monitoring may be a heatmap of the integrated circuit chip that identifies the hotspots on the chip.

FIG. 1 is a diagram of a superconducting integrated circuit 100 including in-situ resonators for temperature sensing of regions within the superconducting integrated circuit in accordance with one example. Each resonator may comprise an inductive element (e.g., a meander) of a given impedance and may be shunted by a corresponding capacitor. In one example, each resonator may be implemented as a shunted notch-type half-wavelength resonator. In this example, the shunted notch-type aspect of the resonators relates to the coupling to a capacitor on one end of each of the resonators. Each resonator is a half-wavelength resonator in this example, in that they are open-ended on the non-shunted end and are not connected to the ground terminal. Each resonator may further be coupled to a feed line (e.g., feed line 110). Feed line 110 may be implemented as a microwave transmission line capable of carrying microwave signals having a frequency in a range of 1 GHz to 15 GHz. In this example, resonator 120 may include a meander having a certain length (L1) that is shunted to a capacitor 122. Resonator 130 may include a meander having a certain length (L2) that is shunted to a capacitor 132. Resonator 140 may include a meander having a certain length (L3) that is shunted to a capacitor 142. Resonator 150 may include a meander having a certain length (L4) that is shunted to a capacitor 152. Resonator 160 may include a meander having a certain length (L5) that is shunted to a capacitor 162. The length of each meander associated with a resonator may be selected to target a specific resonant frequency. The meander may provide the inductance associated with the resonator. The specific resonant frequency can be used as a signature to correlate the response to a particular spatial location on a chip (or another packaged implementation) within superconducting integrated circuit 100.

With continued reference to FIG. 1, in one example, each resonator may be made of materials that have a higher kinetic inductance than the kinetic inductance of pure niobium (referred to as "higher kinetic inductance" materials hereafter). Examples of the higher kinetic inductance materials include, but are not limited to, niobium nitride (NbN) and niobium titanium nitride (NbTiN). Such materials may allow for a higher resolution in terms of losses caused by the operating temperature changes. This is because lambda ($\lambda$), which may be used to represent a measure of the penetration of the magnetic field in a superconductor, increases with the increase in the kinetic inductance of materials. This in turn increases the internal losses in the higher kinetic inductance material-based resonators. This is because the changes in the resonant frequency of a resonator depend on several aspects of a superconductor. As one example, the change in the resonant frequency ($\delta f$) may be expressed by an equation $$\delta f \propto \left(\frac{2\lambda_{eff}}{d}\right)^{-1/2},$$

where d is the dielectric thickness and $\lambda_{eff} = \lambda_L \coth(b/\lambda_L)$ is the effective penetration depth in the finite thickness regime, where $\lambda_L$ is the London penetration depth (material parameter) and b is the superconductor thickness. Therefore, if one increases $\lambda_L$ (resulting in higher kinetic inductance) or even makes the superconductor very thin (to increase $\lambda_{eff}$), there will be a larger change in resonant frequency as a function of the changes in the temperature, which in turn increases the resolution at low temperatures. For similar reasons, the internal quality factor ($Q_i$) may also change with the changes in the temperature. In other words, given the high internal quality ($Q_i$) factor achievable with the higher kinetic inductance materials-based resonators, several shunted resonators of different length can be added to a feed line at different locations on the superconducting integrated circuit chip. The high internal quality factor ($Q_i$) of the resonators allows sufficient temperature resolution by not having overlapping peaks among resonators of different lengths. Even 0.5 Kelvin change in the temperature of a resonator may shift the resonance of the resonator by as much as 1 percent. Assuming superconducting integrated circuit 100 is formed using a superconducting material (e.g., niobium) having a critical temperature ($T_c$), where the critical temperature ($T_c$) corresponds to a temperature at or below which the superconducting material becomes superconductive, the operating temperature of regions within the superconducting integrated circuit may vary within a range of 1 Kelvin to the critical temperature ($T_c$). The lengths of the resonators are selected such that the insertion loss is variable in an amount sufficient to enable a detection of a change in an operating temperature of a region within the superconducting integrated circuit by an amount of at least 100 milli-Kelvin within at least the range of 1 Kelvin to the critical temperature ($T_c$). Although FIG. 1 shows a certain number of resonators as part of superconducting integrated circuit 100 that are arranged in a certain manner, there could be more or fewer number of resonators arranged differently. As another example, although FIG. 1 shows only one feed line, a superconducting integrated circuit may include additional feed lines. In addition, although FIG. 1 shows resonators as straight lines, they could be implemented as a meandering line or using other shapes. In addition, the in-situ resonators may also be used for temperature monitoring in quantum computing circuits, which may be packaged using different packaging technologies, including 3-D packages or other types of packages.

Figures 2A, 2B:
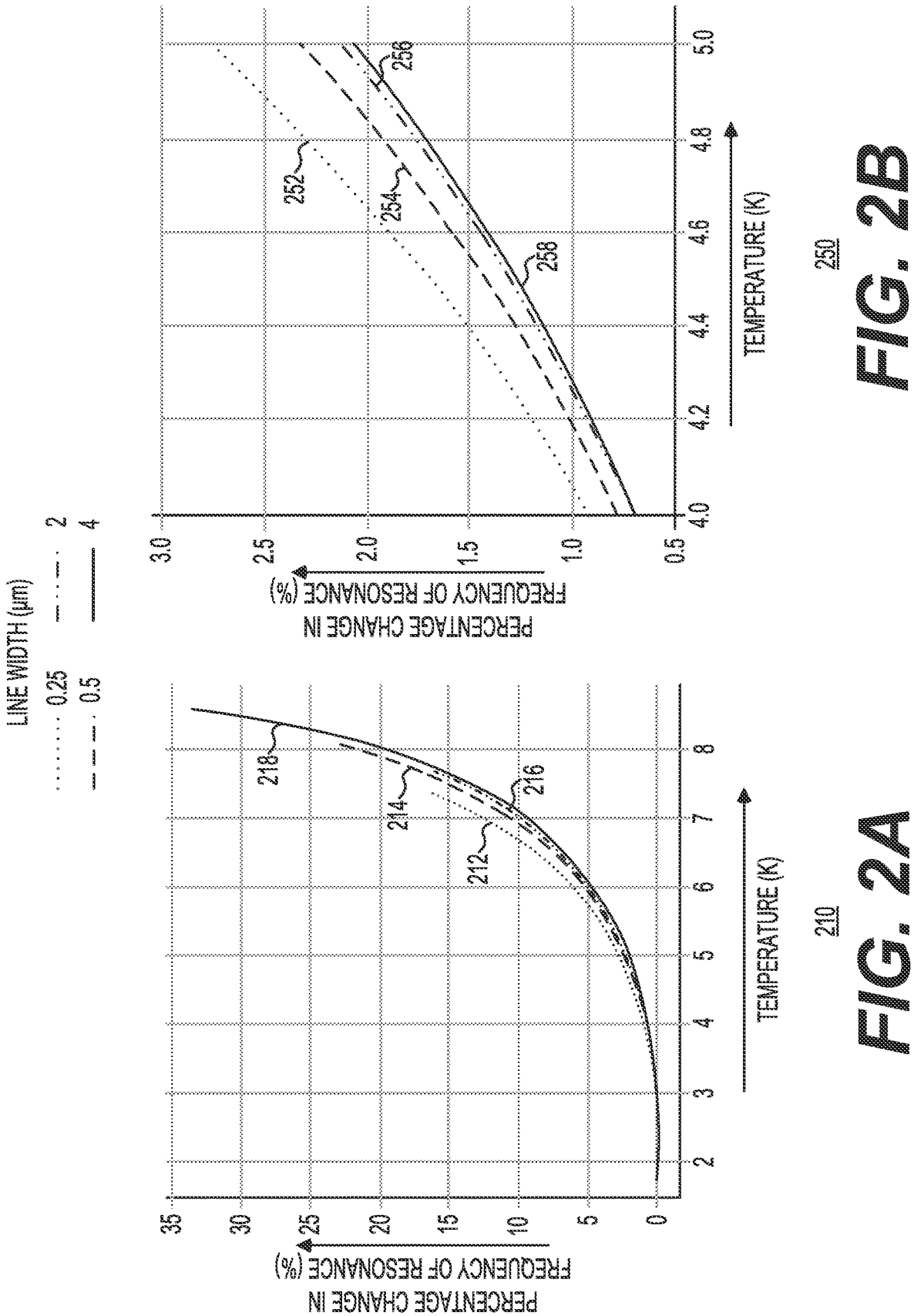
FIGS. 2A and 2B are graphs showing the temperature dependence of the frequency of resonance for resonators having different line widths in accordance with one example.

FIGS. 2A and 2B are graphs 210 and 250 showing the temperature dependence of the frequency of resonance for resonators having different line widths in accordance with one example. An integrated circuit chip including superconducting circuits may have different regions with different temperatures. As an example, regions having a large amount of frequency sweep may have a higher temperature than the other regions. Other differences in the density of the circuits in the layout may also play a part in differing temperatures in different regions of the integrated circuit chip. Thus, a superconducting integrated circuit may have a temperature in its different regions from anywhere between 2 Kelvin to 9 Kelvin. During the development of the chip, such regions may be identified by evaluating the frequency response of the resonators located in the various regions of the chip. Instruments, such as a vector network analyzer (VNA), may be used to analyze the change in the frequency resonance based on the temperature. Measurements may be taken once the chip is first supplied power and thereafter at periodic intervals once it has been turned on. This may help determine the spatial location of the hotspots in the chip. In one example, a hotspot region may correspond to a region having a temperature that is at least one degree Kelvin above the operating temperature. Thus, if the operating temperature is 4.2 K, then any regions having a temperature at least one degree Kelvin above 4.2 K may be identified as hotspots. Design changes may be made to ensure more uniform temperature across the chip.

Graph 210 (FIG. 2A) shows the percentage change in the frequency of resonance based on changes in the temperature for resonators having different line widths. Thus, curve 212 shows the percentage change in the frequency of resonance for a resonator having a line width of 0.25 microns (μm); curve 214 shows the percentage change in the frequency of resonance for a resonator having a line width of 0.5 microns (μm); curve 216 shows the percentage change in the frequency of resonance for a resonator having a line width of 2 microns (μm); and curve 218 shows the percentage change in the frequency of resonance for a resonator having a line width of 4 microns (μm). As shown via these curves, at lower temperatures (e.g., 2K or 3K), the variation in the resonant frequency is not as pronounced as it is at higher temperatures (e.g., 5K-7K). As shown further via these curves, the smaller the width of the line the greater the resolution is in terms of detecting the percentage change in the frequency of resonance.

Graph 250 (FIG. 2B) also shows the percentage change in the frequency of resonance based on changes in the temperature for resonators having different line widths. Graph 250, however, shows the percentage changes over a range of 4 K to 5 K. Thus, curve 252 shows the percentage change in the frequency of resonance for a resonator having a line width of 0.25 microns (μm); curve 254 shows the percentage change in the frequency of resonance for a resonator having a line width of 0.5 microns (μm); curve 256 shows the percentage change in the frequency of resonance for a resonator having a line width of 2 microns (μm); and curve 258 shows the percentage change in the frequency of resonance for a resonator having a line width of 4 microns (μm). Both graphs 210 and 250 illustrate the temperature dependence of the frequency of resonance of the resonators and are not drawn to scale.

Figures 3A, 3B:
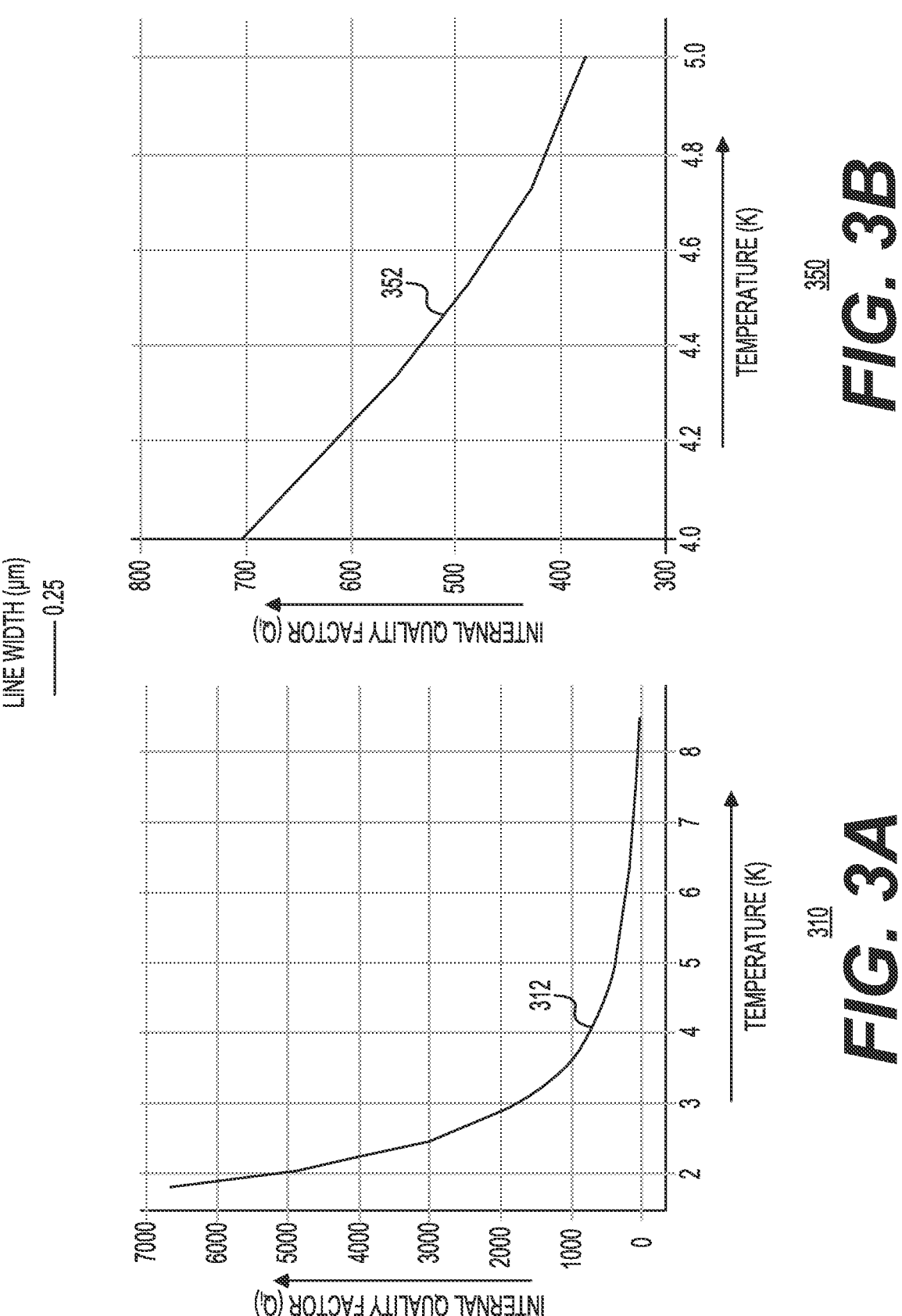
FIGS. 3A and 3B are graphs showing the temperature dependence of the internal quality factor of a resonator with a certain width in accordance with one example.

FIGS. 3A and 3B are graphs 310 and 350 showing the temperature dependence of the internal quality factor ($Q_i$) of a resonator with a certain width in accordance with one example. Curve 312 shows the changes in the internal quality factor ($Q_i$) of a resonator having a width of 0.25 microns (μm) over a temperature range of 1 K to 8 K. Curve 352 shows the changes in the internal quality factor ($Q_i$) of the same resonator over a temperature range of 4 K to 5 K. In sum, both the internal quality factor ($Q_i$) and the resonance frequency can be used to track temperature changes. While the changes in the resonance frequency provide a higher resolution at temperatures closer to the transition temperature ($T_c$) of the superconducting resonators, the changes in the internal quality factor ($Q_i$) provide a higher resolution at temperatures farther away from the transition temperature ($T_c$) of the superconducting resonators.

Figure 4A:
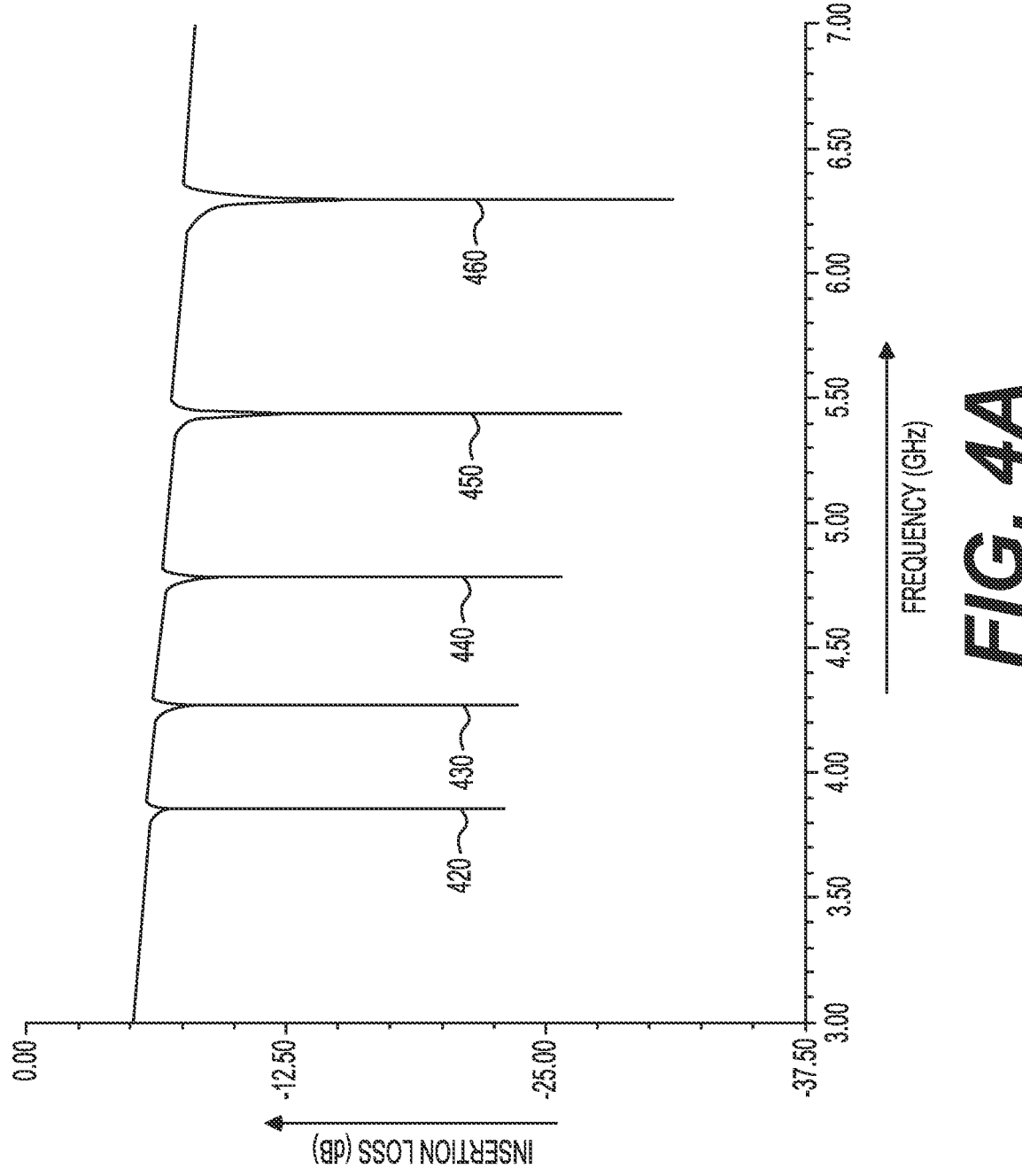
FIG. 4A is a diagram showing plots of the insertion loss for the resonators shown in FIG. 1 over a range of frequency in accordance with one example.

FIG. 4A is a diagram showing plots of the insertion loss for the resonators shown in FIG. 1 over a range of frequency in accordance with one example. This diagram plots insertion loss (Y-axis) versus the resonance frequency of a resonator for the resonators shown in FIG. 1. The insertion loss is represented using the S-parameter plots for each of the resonators described with respect to FIG. 1. Plot 420 shows the insertion loss for resonator 120 of FIG. 1. Plot 430 shows the insertion loss for resonator 130 of FIG. 1. Plot 440 shows the insertion loss for resonator 140 of FIG. 1. Plot 450 shows the insertion loss for resonator 150 of FIG. 1. Plot 460 shows the insertion loss for resonator 160 of FIG. 1. As shown via these plots, the resonant frequency for the resonators differs based on the length of the resonator. Moreover, the insertion loss for each resonator is different.

Figure 4B:
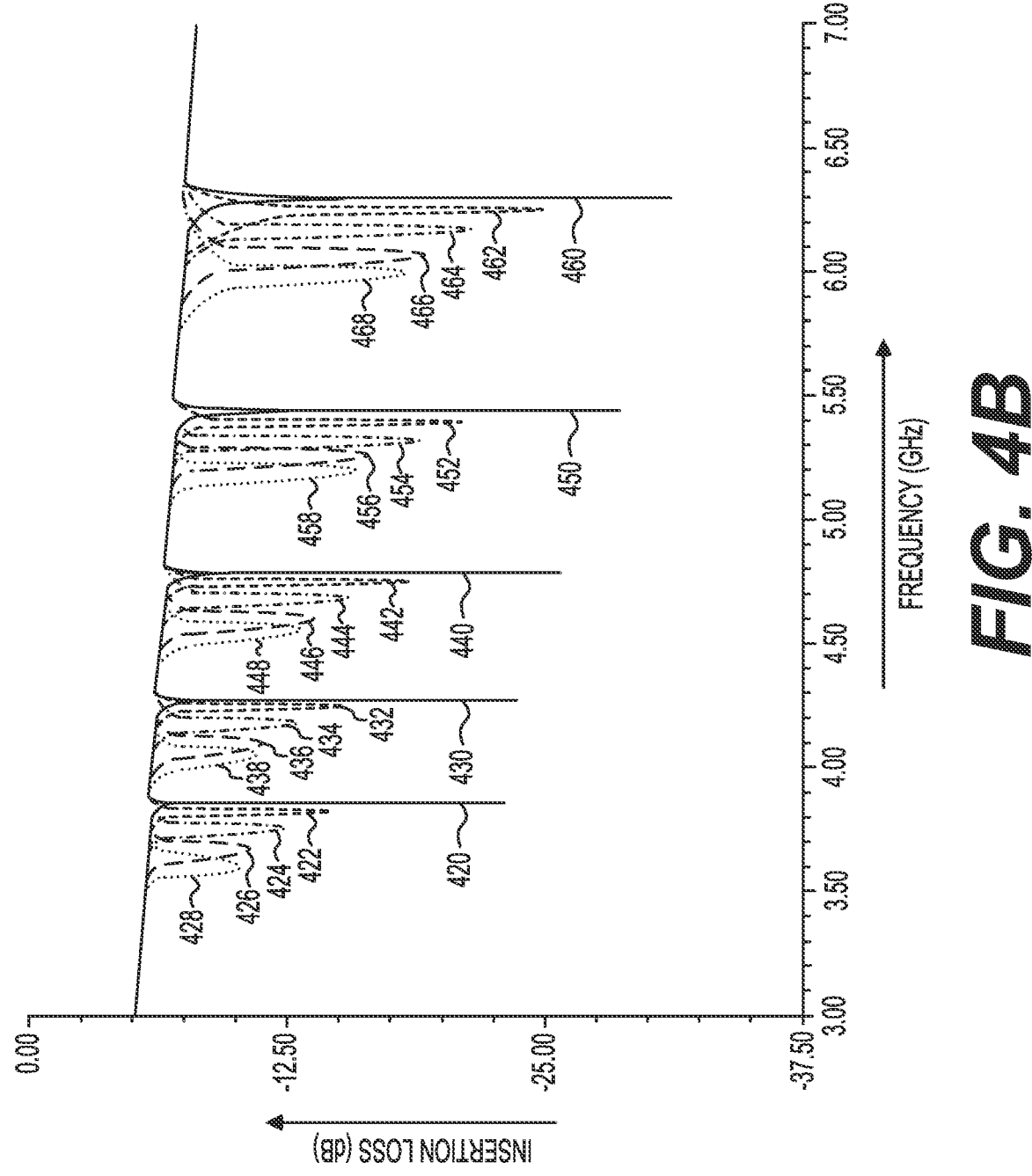
FIG. 4B is a diagram showing plots of the insertion losses for the resonators shown in FIG. 1 over the same range of frequency as in FIG. 4A but at different operating temperatures in accordance with one example.

FIG. 4B is a diagram showing plots of the insertion losses for the resonators shown in FIG. 1 over the same range of frequency as in FIG. 4A but at different operating temperatures in accordance with one example. Plot 420 shows the insertion loss for resonator 120 of FIG. 1 at an operating temperature of approximately 2 K. Plot 422 shows the insertion loss for resonator 120 of FIG. 1 at an operating temperature of approximately 3 K. Plot 424 shows the insertion loss for resonator 120 of FIG. 1 at an operating temperature of approximately 4 K. Plot 426 shows the insertion loss for resonator 120 of FIG. 1 at an operating temperature of approximately 5 K. Plot 428 shows the insertion loss for resonator 120 of FIG. 1 at an operating temperature of approximately 6 K. Plot 432 shows the insertion loss for resonator 130 of FIG. 1 at an operating temperature of approximately 3 K. Plot 434 shows the insertion loss for resonator 130 of FIG. 1 at an operating temperature of approximately 4 K. Plot 436 shows the insertion loss for resonator 130 of FIG. 1 at an operating temperature of approximately 5 K. Plot 438 shows the insertion loss for resonator 130 of FIG. 1 at an operating temperature of approximately 6 K.

With continued reference to FIG. 4B, plot 442 shows the insertion loss for resonator 140 of FIG. 1 at an operating temperature of approximately 3 K. Plot 444 shows the insertion loss for resonator 140 of FIG. 1 at an operating temperature of approximately 4 K. Plot 446 shows the insertion loss for resonator 140 of FIG. 1 at an operating temperature of approximately 5 K. Plot 448 shows the insertion loss for resonator 140 of FIG. 1 at an operating temperature of approximately 6 K. Plot 452 shows the insertion loss for resonator 150 of FIG. 1 at an operating temperature of approximately 3 K. Plot 454 shows the insertion loss for resonator 150 of FIG. 1 at an operating temperature of approximately 4 K. Plot 456 shows the insertion loss for resonator 150 of FIG. 1 at an operating temperature of approximately 5 K. Plot 458 shows the insertion loss for resonator 150 of FIG. 1 at an operating temperature of approximately 6 K. Plot 462 shows the insertion loss for resonator 160 of FIG. 1 at an operating temperature of approximately 3 K. Plot 464 shows the insertion loss for resonator 160 of FIG. 1 at an operating temperature of approximately 4 K. Plot 466 shows the insertion loss for resonator 160 of FIG. 1 at an operating temperature of approximately 5 K. Plot 468 shows the insertion loss for resonator 160 of FIG. 1 at an operating temperature of approximately 6 K. The plots in FIG. 4B are not drawn to scale and are drawn to only illustrate the approximate differences in insertion loss for the resonators of different lengths at different operating temperatures. As evident from simulations, however, using different length resonators attached to a single feed line, one can achieve thermal resolution to detect temperature variation even as low as in the tens of milli-Kelvins.

Figure 5:
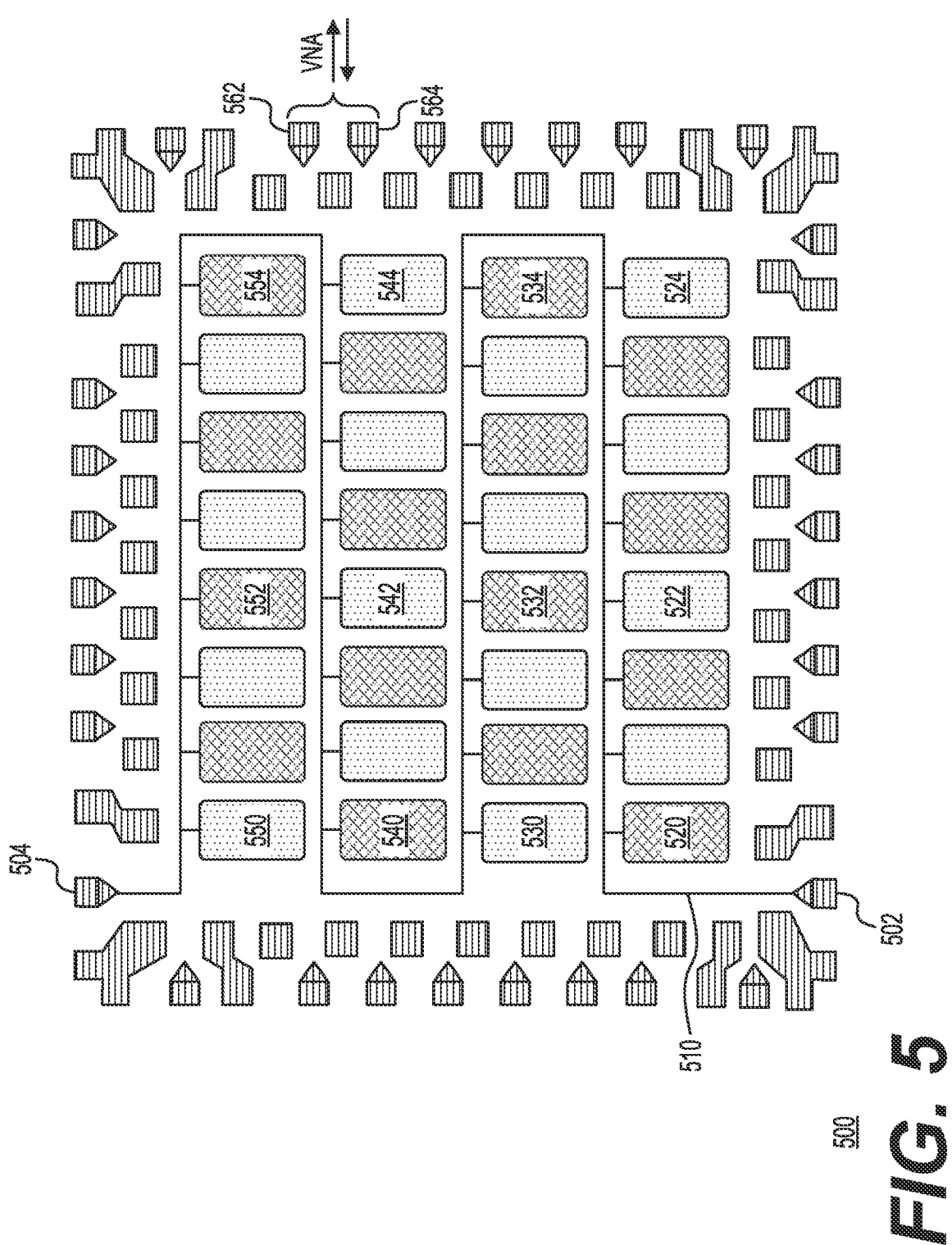
FIG. 5 is a diagram of a floor plan of a superconducting integrated circuit (IC) chip showing a single feed line coupled to resonators placed in different spatial locations of two metal layers of the chip in accordance with one example.

FIG. 5 is a diagram of a floor plan 500 of a superconducting integrated circuit (IC) chip showing a single feed line coupled to resonators placed in different spatial locations of two metal layers of the chip. In this example, feed line 510 is coupled to an ingress pad 502 and a return pad 504. Feed line 510 is further coupled to resonators, including resonators 520, 522, 524, 530, 532, 534, 540, 542, 544, 550, 552, and 554. In this example, resonators 522, 524, 530, 542, 544, and 550 are formed in one of the metal layers associated with the superconducting IC chip. Other resonators 520, 532, 534, 540, 552, and 554 are formed in a different metal layer. In one example, one of these layers may be a metal layer that is closer to a top surface of the superconducting IC chip; and the other layer may be a metal layer that is closer to a bottom surface of the superconducting IC chip. Signals associated with the frequency response of the resonators may be coupled to an external vector network analyzer (VNA) via pads 562 and 564. Alternatively, at least a subset of the functionality associated with the VNA may be implemented as part of the superconducting IC chip itself. Each resonator can be designed with a specific length relating to a specific resonant frequency. Because the resonators are spatially located in different regions of the floor plan 500 of the chip, the specific resonant frequency can be used as a signature to correlate the response to a particular spatial location on the chip.

With continued reference to FIG. 5, instruments, such as a vector network analyzer (VNA), may be used to analyze the change in the frequency resonance based on the temperature. Measurements may be taken once the chip is first supplied power and thereafter at periodic intervals once it has been turned on. This may help determine the spatial location of the hotspots in the chip. In one example, a hotspot region may correspond to a region having a temperature that is at least one degree Kelvin above the operating temperature. Thus, if the operating temperature is 4.2 K, then any regions having a temperature at least one degree Kelvin above 4.2 K may be identified as hotspots. Design changes may be made to ensure more uniform temperature across the chip. Although FIG. 5 shows a certain floor plan 500 with certain location of the resonators, the superconducting IC chip may have a different floor plan and the resonators may be located in regions other than the ones shown in FIG. 5.

Figure 6:
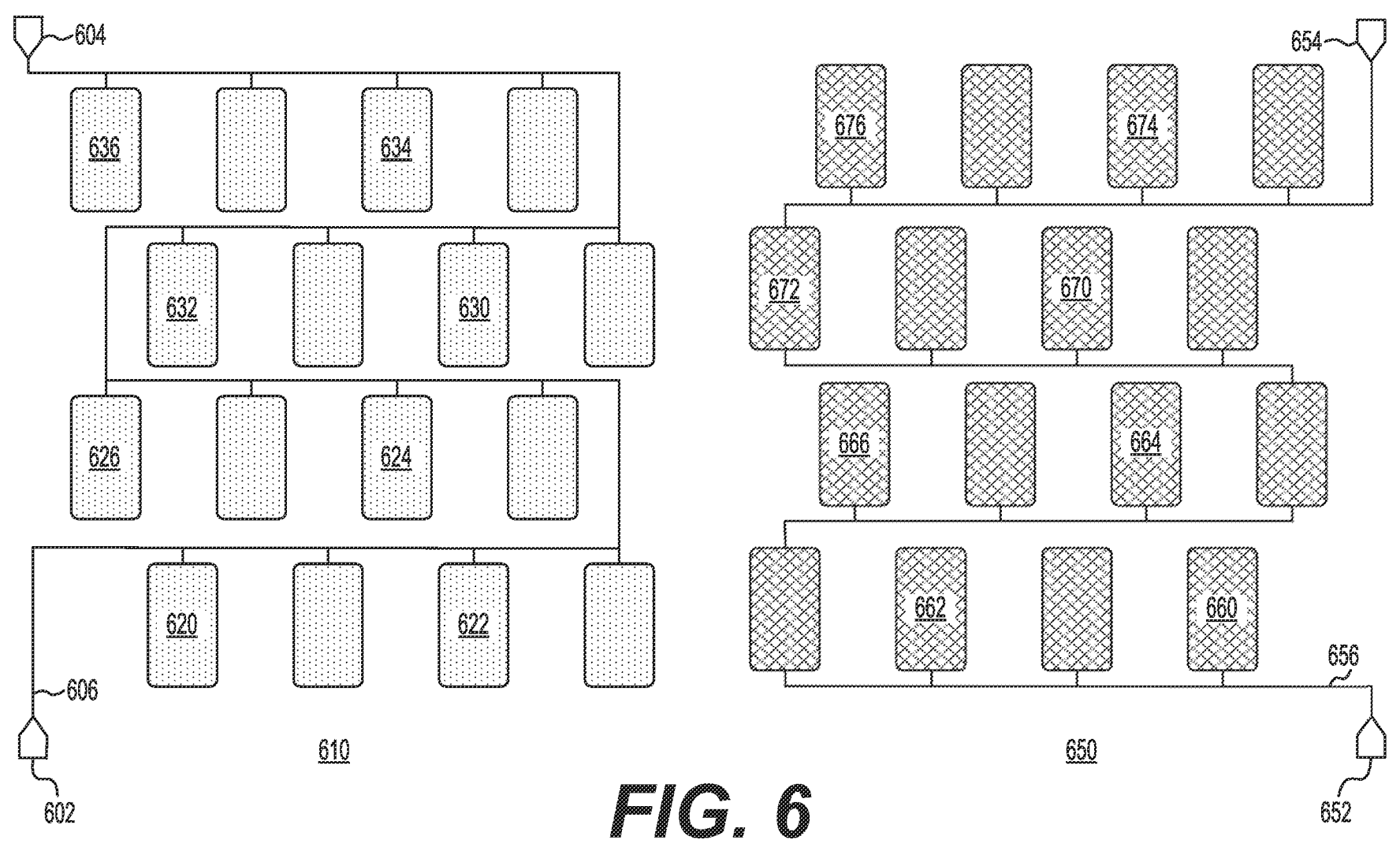

FIG. 6 is a diagram of a floor plan 610 of a top player of a superconducting integrated circuit (IC) chip including a feed line coupled to resonators placed in different spatial locations of the top layer of the superconducting IC chip and a floor plan 650 of a bottom layer of the superconducting IC chip including a bottom feed line coupled to resonators placed in different spatial locations of the bottom layer of the superconducting IC chip. In this example, as shown in floor plan 610, one feed line 606 is coupled to an ingress pad 602 and a return pad 604. Feed line 606 is further coupled to resonators, including resonators 620, 622, 624, 626, 630, 632, 634, and 636. In this example, resonators 620, 622, 624, 626, 630, 632, 634, and 636 are formed in one of the metal layers associated with the superconducting IC chip. As shown in floor plan 650, the other feed line 656 is coupled to an ingress pad 652 and a return pad 654. Feed line 656 is further coupled to resonators, including resonators 660, 662, 664, 666, 670, 672, 674, and 676. In this example, resonators 660, 662, 664, 666, 670, 672, 674, and 676 are formed in one of the metal layers associated with the superconducting IC chip. In one example, one of these layers may be a metal layer that is closer to a top surface of the superconducting IC chip; and the other layer may be a metal layer that is closer to a bottom surface of the superconducting IC chip. Signals associated with the frequency response of the resonators may be coupled to an external vector network analyzer (VNA) via pads (not shown). Alternatively, at least a subset of the functionality associated with the VNA may be implemented as part of the superconducting IC chip itself. Each resonator can be designed with a specific length relating to a specific resonant frequency. Because the resonators are spatially located in different regions of the floor plans 610 and 650 of the chip, the specific resonant frequency can be used as a signature to correlate the response to a particular spatial location on the chip.

With continued reference to FIG. 6, instruments, such as a vector network analyzer (VNA), may be used to analyze the change in the frequency resonance based on the temperature. Measurements may be taken once the chip is first supplied power and thereafter at periodic intervals once it has been turned on. This may help determine the spatial location of the hotspots in the chip. In one example, a hotspot region may correspond to a region having a temperature that is at least one degree Kelvin above the operating temperature. Thus, if the operating temperature is 4.2 K, then any regions having a temperature at least one degree Kelvin above 4.2 K may be identified as hotspots. Design changes may be made to ensure more uniform temperature across the chip. Although FIG. 6 shows a floor plans 610 and 650 with certain location of the resonators, the superconducting IC chip may have different floor plans and the resonators may be located in regions other than the ones shown in FIG. 6.

Figure 7:
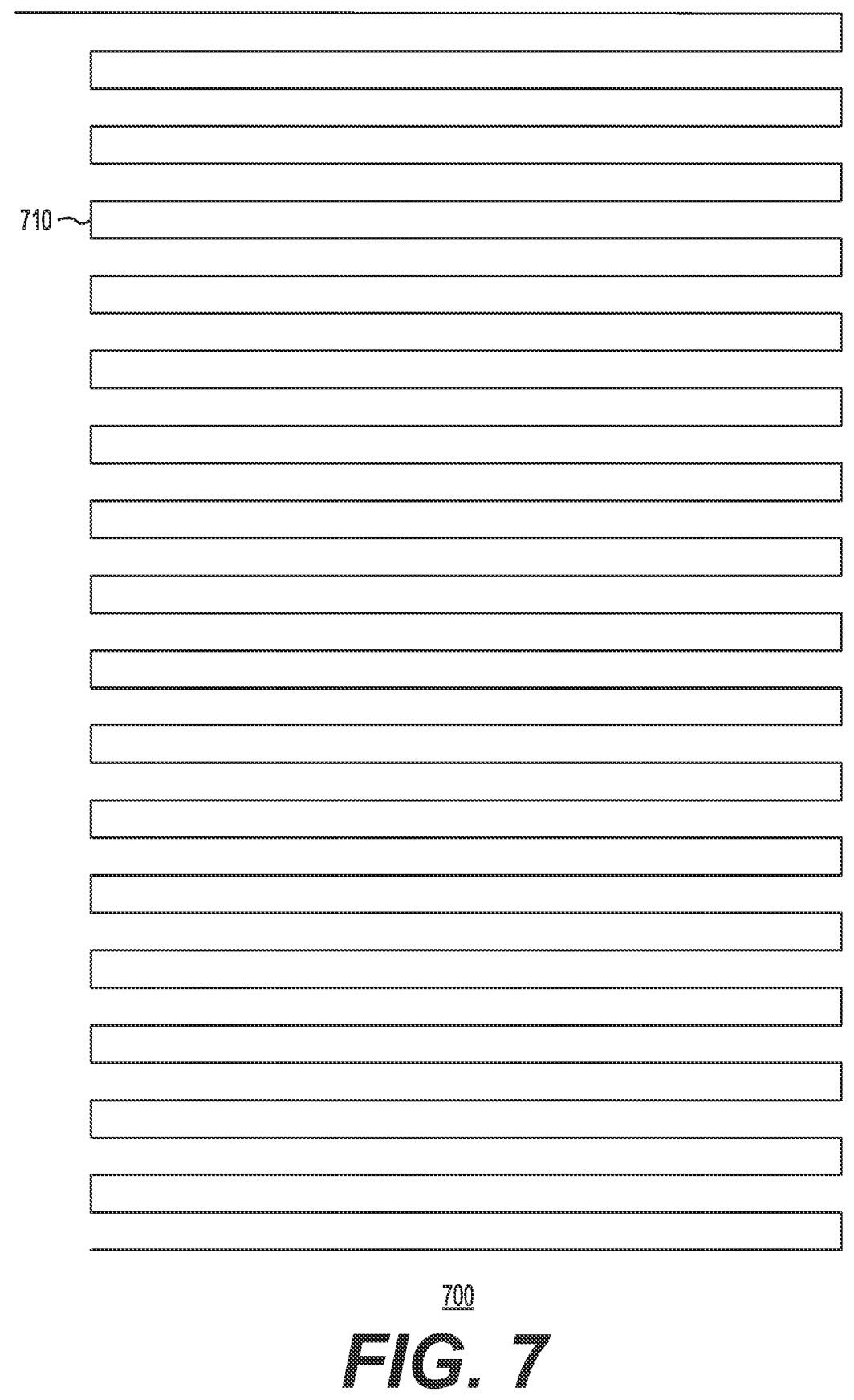

FIG. 7 shows a top view 700 of a resonator 710 formed as a meander in a superconducting integrated circuit in accordance with one example. As explained earlier, resonator 710 may be formed using higher kinetic inductance materials, such as niobium nitride (NbN) and niobium titanium nitride (NbTiN). Each of the resonators shown in the previous figures may be formed as a meander. The length of the resonator may be chosen to provide a certain impedance. As explained earlier, resonator 710 shunted with a capacitor may have a specific resonance frequency. In a superconducting integrated circuit, many resonators like the one shown in FIG. 7 may be formed at different spatial locations. Although FIG. 7 shows a certain shape and structure of resonator 710, other shapes and structures may also be used.

FIG. 8 is a flow chart 800 of a method for sensing an operating temperature of regions within a superconducting integrated circuit. In one example, this method may be performed to detect hotspots in a superconducting integrated circuit. The superconducting integrated circuit may be any of such circuits described earlier with the resonators having different lengths. Step 810 may include using a feed line, providing a test signal to each of a first resonator and a second resonator to elicit a frequency response from the first resonator or the second resonator. Any microwave signal source may be used to provide the test signal by coupling this source to a feed line via pads associated with the integrated circuit. As an example, as described earlier with respect to FIG. 5, a test signal may be coupled to feed line 510 via pads 502 and 504.

Step 820 may include correlating the frequency response with a first region within the superconducting integrated circuit corresponding to the first spatial location associated with the first resonator or with a second region within the superconducting integrated circuit corresponding to the second spatial location associated with the second resonator. As an example, as described earlier with respect to FIG. 1, resonator 120 may include a meander having a certain length (L1) that is shunted to a capacitor 122. Resonator 130 may include a meander having a certain length (L2) that is shunted to a capacitor 132. Resonator 140 may include a meander having a certain length (L3) that is shunted to a capacitor 142. Resonator 150 may include a meander having a certain length (L4) that is shunted to a capacitor 152. Resonator 160 may include a meander having a certain length (L5) that is shunted to a capacitor 152. The length of each meander associated with a resonator may be selected to target a specific resonant frequency. The specific resonant frequency may be used as a signature to correlate the response to a particular spatial location on a chip (or another packaged implementation) within superconducting integrated circuit 100. Although flow chart 800 shows a certain number of steps, the method described with respect to FIG. 8 may include additional steps.

In conclusion, in one example, the present disclosure relates to a superconducting integrated circuit including a first resonator having a first resonant frequency, where the first resonator has a first spatial location in relation to a floor plan of the superconducting integrated circuit. The superconducting integrated circuit may further include a second resonator having a second resonant frequency, different from the first resonant frequency, where the second resonator has a second spatial location in relation to the floor plan of the superconducting integrated circuit, and where the second spatial location is different from the first spatial location. The superconducting integrated circuit may further include a feed line configured to provide a test signal to each of the first resonator and the second resonator in order to elicit a frequency response from the first resonator or the second resonator, where the frequency response is correlated with a first region within the superconducting integrated circuit corresponding to the first spatial location or with a second region within the superconducting integrated circuit corresponding to the second spatial location.

The first resonator may comprise a first inductive element and it may be shunted by a first capacitive element, and the second resonator may comprise a second inductive element and it may be shunted by a second capacitive element. The first inductive element may comprise a first meandering inductor having a first length, and the second inductive element, may comprise a second meandering inductor having a second length, and where the second length is selected to be different from the first length. In one example, the first length may be selected to target the first resonant frequency, and the second length may be selected to target the second resonant frequency.

The frequency response may comprise one of: (1) a first insertion loss associated with the first resonator when resonating at the first resonant frequency, or (2) a second insertion loss associated with the second resonator when resonating at the second frequency. Each of the first inductive element and the second inductive element may comprise a material having a higher kinetic inductance than that of niobium.

The superconducting integrated circuit may be formed using a superconducting material having a critical temperature ($T_c$), where the critical temperature ($T_c$) corresponds to a temperature at or below which the superconducting material becomes superconductive. The operating temperature of regions within the superconducting integrated circuit may be variable within a range of 1 Kelvin to the critical temperature ($T_c$). Each of the first insertion loss and the second insertion loss may be variable in an amount sufficient to enable a detection of a change in an operating temperature of a region within the superconducting integrated circuit by an amount of at least 100 milli-Kelvin within at least the range of 1 Kelvin to the critical temperature ($T_c$).

In another aspect, the present disclosure relates to a method for sensing an operating temperature of regions within a superconducting integrated circuit, where the superconducting integrated circuit comprises a first resonator having a first resonant frequency, where the first resonator has a first spatial location in relation to a floor plan of the superconducting integrated circuit and a second resonator having a second resonant frequency, different from the first resonant frequency, where the second resonator has a second spatial location in relation to the floor plan of the superconducting integrated circuit, and where the second spatial location is different from the first spatial location. The method may include using a feed line, providing a test signal to each of the first resonator and the second resonator to elicit a frequency response from the first resonator or the second resonator. The method may further include correlating the frequency response with a first region within the superconducting integrated circuit corresponding to the first spatial location associated with the first resonator or with a second region within the superconducting integrated circuit corresponding to the second spatial location associated with the second resonator.

The first resonator may comprise a first inductive element and it may be shunted by a first capacitive element, and the second resonator may comprise a second inductive element and it may be shunted by a second capacitive element. The first inductive element may comprise a first meandering inductor having a first length, and the second inductive element may comprise a second meandering inductor having a second length, where the second length is selected to be different from the first length. In one example, the first length may be selected to target the first resonant frequency, and the second length may be selected to target the second resonant frequency.

The frequency response may comprise one of: (1) a first insertion loss associated with the first resonator when resonating at the first resonant frequency, or (2) a second insertion loss associated with the second resonator when resonating at the second frequency. Each of the first inductive element and the second inductive element may comprise a material having a higher kinetic inductance than that of niobium.

The superconducting integrated circuit may be formed using a superconducting material having a critical temperature ($T_c$), where the critical temperature ($T_c$) corresponds to a temperature at or below which the superconducting material becomes superconductive. The operating temperature of regions within the superconducting integrated circuit may be variable within a range of 1 Kelvin to the critical temperature ($T_c$). Each of the first insertion loss and the second insertion loss may be variable in an amount sufficient to enable a detection of a change in an operating temperature of a region within the superconducting integrated circuit by an amount of at least 100 milli-Kelvin within at least the range of 1 Kelvin to the critical temperature ($T_c$).

In yet another aspect, the present disclosure relates to a superconducting integrated circuit including a first resonator having a first resonant frequency, where the first resonator comprises a first inductive element shunted by a first capacitive element, where the first inductive element comprises a first meandering inductor having a first length, and where the first resonator has a first spatial location in relation to a floor plan of the superconducting integrated circuit. The superconducting integrated circuit may further include a second resonator having a second resonant frequency, different from the first resonant frequency, where the second resonator comprises a second inductive element shunted by a second capacitive element, where the second inductive element comprises a second meandering inductor having a second length, where the second length is selected to be different from the first length by an amount sufficient to ensure a detectable difference between the first resonant frequency and the second resonant frequency, where the second resonator has a second spatial location in relation to the floor plan of the superconducting integrated circuit, and where the second spatial location is different from the first spatial location. The superconducting integrated circuit may further include a feed line configured to provide a test signal to each of the first resonator and the second resonator in order to elicit a frequency response from the first resonator or the second resonator, where the frequency response is correlated with a first region within the superconducting integrated circuit corresponding to the first spatial location or with a second region within the superconducting integrated circuit corresponding to the second spatial location.

The first length may be selected to target the first resonant frequency, and the second length may be selected to target the second resonant frequency. The frequency response may comprise one of: (1) a first insertion loss associated with the first resonator when resonating at the first resonant frequency, or (2) a second insertion loss associated with the second resonator when resonating at the second frequency.

The superconducting integrated circuit may be formed using a superconducting material having a critical temperature ($T_c$), where the critical temperature ($T_c$) corresponds to a temperature at or below which the superconducting material becomes superconductive. The operating temperature of regions within the superconducting integrated circuit may be variable within a range of 1 Kelvin to the critical temperature ($T_c$). Each of the first insertion loss and the second insertion loss may be variable in an amount sufficient to enable a detection of a change in an operating temperature of a region within the superconducting integrated circuit by an amount of at least 100 milli-Kelvin within at least the range of 1 Kelvin to the critical temperature ($T_c$).

In one example, each of the first inductive element and the second inductive element may comprise a material having a higher kinetic inductance than that of niobium. In another example, each of the first inductive element and the second inductive element may comprise one of niobium nitride (NbN) or niobium titanium nitride (NbTiN).

It is to be understood that the methods, modules, devices, systems, and components depicted herein are merely exemplary. Alternatively, or in addition, the functionally described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with the examples described in this disclosure can also include instructions stored in a non-transitory media. The term "non-transitory media" as used herein refers to any media storing data and/or instructions that cause a machine to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory, such as, DRAM, SRAM, a cache, or other such media. Non-transitory media is distinct from, but can be used in conjunction with transmission media. Transmission media is used for transferring data and/or instruction to or from a machine. Exemplary transmission media include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A system comprising:
   a superconducting integrated circuit comprising:
      a first resonator having a first resonant frequency, wherein the first resonator has a first spatial location in relation to a floor plan of the superconducting integrated circuit;
      a second resonator having a second resonant frequency, different from the first resonant frequency, wherein the second resonator has a second spatial location in relation to the floor plan of the superconducting integrated circuit, and wherein the second spatial location is different from the first spatial location;
      a feed line configured to provide a test signal to each of the first resonator and the second resonator in order to elicit a frequency response from the first resonator or the second resonator, wherein the first resonant frequency and the second resonant frequency, respectively, acts as a signature to correlate the frequency response with a first region within the superconducting integrated circuit corresponding to the first spatial location or with a second region within the superconducting integrated circuit corresponding to the second spatial location; and
   a vector network analyzer (VNA) configured to receive signals associated with the frequency response from pads associated with the superconducting integrated circuit and to analyze any changes in the frequency response based on temperature to determine whether the first region or the second region corresponds to a hotspot region.

2. The system of claim 1, wherein the first resonator comprises a first inductive element and is shunted by a first capacitive element, and wherein the second resonator comprises a second inductive element and is shunted by a second capacitive element.

3. The system of claim 2, wherein the first inductive element comprises a first meandering inductor having a first length, wherein the second inductive element comprises a second meandering inductor having a second length, and wherein the second length is selected to be different from the first length.

4. The system of claim 3, wherein the first length is selected to target the first resonant frequency, and wherein the second length is selected to target the second resonant frequency.

5. The system of claim 1, wherein the frequency response comprises one of: (1) a first insertion loss associated with the first resonator when resonating at the first resonant frequency, or (2) a second insertion loss associated with the second resonator when resonating at the second resonant frequency.

6. The superconducting integrated circuit of claim 5, wherein the superconducting integrated circuit is formed using a superconducting material having a critical temperature ($T_c$), wherein the critical temperature ($T_c$) corresponds to a temperature at or below which the superconducting material becomes superconductive, wherein the operating temperature of regions within the superconducting integrated circuit is variable within a range of 1 Kelvin to the critical temperature ($T_c$), and wherein each of the first insertion loss and the second insertion loss is variable in an amount sufficient to enable a detection of a change in an operating temperature of a region within the superconducting integrated circuit by an amount of at least 100 milli-Kelvin within at least the range of 1 Kelvin to the critical temperature ($T_c$).

7. The system of claim 2, wherein each of the first inductive element and the second inductive element comprises a material having a higher kinetic inductance than that of niobium.

8. A system comprising:
a superconducting integrated circuit comprising:
a first resonator having a first resonant frequency, wherein the first resonator comprises a first inductive element and is shunted by a first capacitive element, wherein the first inductive element comprises a first meandering inductor having a first length, and wherein the first resonator has a first spatial location in relation to a floor plan of the superconducting integrated circuit;
a second resonator having a second resonant frequency, different from the first resonant frequency, wherein the second resonator comprises a second inductive element and is shunted by a second capacitive element, wherein the second inductive element comprises a second meandering inductor having a second length, wherein the second length is selected to be different from the first length by an amount sufficient to ensure a detectable difference between the first resonant frequency and the second resonant frequency, wherein the second resonator has a second spatial location in relation to the floor plan of the superconducting integrated circuit, and wherein the second spatial location is different from the first spatial location;
a feed line configured to provide a test signal to each of the first resonator and the second resonator in order to elicit a frequency response from the first resonator or the second resonator, wherein the first resonant frequency and the second resonant frequency, respectively, acts as a signature to correlate the frequency response with a first region within the superconducting integrated circuit corresponding to the first spatial location or with a second region within the superconducting integrated circuit corresponding to the second spatial location;
a vector network analyzer (VNA) configured to receive signals associated with the frequency response from pads associated with the superconducting integrated circuit and to analyze any changes in the frequency response based on temperature to determine whether the first region or the second region corresponds to a hotspot region.

9. The system of claim 8, wherein the first length is selected to target the first resonant frequency, and wherein the second length is selected to target the second resonant frequency.

10. The system of claim 8, wherein the frequency response comprises one of: (1) a first insertion loss associated with the first resonator when resonating at the first resonant frequency, or (2) a second insertion loss associated with the second resonator when resonating at the second resonant frequency.

11. The system of claim 10, wherein the superconducting integrated circuit is formed using a superconducting material having a critical temperature ($T_c$), wherein the critical temperature ($T_c$) corresponds to a temperature at or below which the superconducting material becomes superconductive, wherein the operating temperature of regions within the superconducting integrated circuit is variable within a range of 1 Kelvin to the critical temperature ($T_c$), and wherein each of the first insertion loss and the second insertion loss is variable in an amount sufficient to enable a detection of a change in an operating temperature of a region within the superconducting integrated circuit by an amount of at least 100 milli-Kelvin within at least the range of 1 Kelvin to the critical temperature ($T_c$).

12. The system of claim 8, wherein each of the first inductive element and the second inductive element comprises a material having a higher kinetic inductance than that of niobium.

13. The system of claim 8, wherein each of the first inductive element and the second inductive element comprises one of niobium nitride (NbN) or niobium titanium nitride (NbTIN).

14. A system comprising:
a superconducting integrated circuit formed within an integrated circuit chip comprising:
a first resonator having a first resonant frequency, wherein the first resonator has a first spatial location in relation to a floor plan of the superconducting integrated circuit, wherein the first resonator is formed in a first metal layer associated with the integrated circuit chip;
a second resonator having a second resonant frequency, different from the first resonant frequency, wherein the second resonator has a second spatial location in relation to the floor plan of the superconducting integrated circuit, and wherein the second spatial location is different from the first spatial location, and wherein the second resonator is formed in a second metal layer, different from the first metal layer, associated with the integrated circuit chip; and a feed line configured to provide a test signal to each of the first resonator and the second resonator in order to elicit a frequency response from the first resonator or the second resonator, wherein the first resonant frequency and the second resonant frequency, respectively, acts as a signature to correlate the frequency response with a first region within the superconducting integrated circuit corresponding to the first spatial location or with a second region within the superconducting integrated circuit corresponding to the second spatial location;

a vector network analyzer (VNA) configured to receive signals associated with the frequency response from pads associated with the superconducting integrated circuit and to analyze any changes in the frequency response based on temperature to determine whether the first region or the second region corresponds to a hotspot region.

15. The superconducting integrated circuit of claim 14, wherein the first resonator comprises a first inductive element and is shunted by a first capacitive element, and wherein the second resonator comprises a second inductive element and is shunted by a second capacitive element.

16. The system of claim 15, wherein the first inductive element comprises a first meandering inductor having a first length, wherein the second inductive element comprises a second meandering inductor having a second length, and wherein the second length is selected to be different from the first length.

17. The system of claim 16, wherein the first length is selected to target the first resonant frequency, and wherein the second length is selected to target the second resonant frequency.

18. The system of claim 14, wherein the frequency response comprises one of: (1) a first insertion loss associated with the first resonator when resonating at the first resonant frequency, or (2) a second insertion loss associated with the second resonator when resonating at the second resonant frequency.

19. The system of claim 18, wherein the superconducting integrated circuit is formed using a superconducting material having a critical temperature ($T_c$), wherein the critical temperature ($T_c$) corresponds to a temperature at or below which the superconducting material becomes superconductive, wherein the operating temperature of regions within the superconducting integrated circuit is variable within a range of 1 Kelvin to the critical temperature ($T_c$), and wherein each of the first insertion loss and the second insertion loss is variable in an amount sufficient to enable a detection of a change in an operating temperature of a region within the superconducting integrated circuit by an amount of at least 100 milli-Kelvin within at least the range of 1 Kelvin to the critical temperature ($T_c$).

20. The system of claim 15, wherein each of the first inductive element and the second inductive element comprises a material having a higher kinetic inductance than that of niobium.

* * * * *